United States Patent [19]

Spielman

[11] Patent Number: 5,793,265
[45] Date of Patent: Aug. 11, 1998

[54] COMPACT DIPLEXER

[75] Inventor: Mark Alan Spielman, Norwalk, Conn.

[73] Assignee: Microphase Corporation, Norwalk, Conn.

[21] Appl. No.: 866,188

[22] Filed: May 30, 1997

[51] Int. Cl.$^6$ .................................................. H03H 7/43
[52] U.S. Cl. ............................ 333/132; 333/168; 333/175
[58] Field of Search .................................. 333/126, 129, 333/132, 134, 167, 168, 175, 185

[56] References Cited

U.S. PATENT DOCUMENTS 5,548,255  8/1996  Spielman ............................... 333/132
5,554,960  9/1996  Ohnuki et al. ........................ 333/132

*Primary Examiner*—Seungsook Ham
*Attorney, Agent, or Firm*—Perman & Green, LLP

[57] ABSTRACT

A diplexer for use in communication of telephony and high-speed data transmission, including television, comprises two filters, each of which is constructed with plural stages in the form of a ladder network, one of the filters being a high-pass filter and the other of the filters being a low-pass filter. The filter components, inductors and capacitors, are located on one or opposed sides of a dielectric substrate. The filter components are arranged to minimize interference between signals traveling in the low-pass filter and the high-pass filter. In the case of a parallel branch of the ladder network in each of the filters, wherein the parallel branch comprises a resonant circuit of inductor and capacitor, the branches of the respective filters are located at opposite parts of the array of the filter components. Inductors are constructed as toroids and, in an embodiment of the invention wherein inductors are located on a top side of the substrate with the capacitors being located on the bottom side of the substrate, the toroids are mounted on the substrate with the toroidal planes being perpendicular to a plane of the substrate and wherein the inductors of three successive stages of a filter are arranged in the configuration of a T to minimize interaction among the inductors. This permits minimization of the physical size of the diplexer.

9 Claims, 4 Drawing Sheets

COMPACT DIPLEXER

BACKGROUND OF THE INVENTION

This invention relates to diplexers suitable for use in concurrent communication of television and telephony signals and, more particularly, to a compact form of diplexers suitable for mounting on an outdoor power line structure for communication with houses adjacent to the power line structure.

Power-line structures comprising a set of power lines supported by poles are used in many locations for providing electric power to private homes as well as to other consumers of electric power. Often, a power-line structure carries also telephone lines for telephonic communication between a house connected to a telephone line and a party at a distant location. Today, in many locations, coaxial lines are being installed upon the power-line structure to provide, for private homes and other facilities, access to cable communication of both telephony and television signals. The coaxial line is capable of two-way communication of signals so that an individual house connected to the coaxial line is able to transmit and receive telephony and relatively wide-bandwidth signals such as television signals and high-speed data transmission signals.

In order to facilitate interconnection of the coaxial line with each user of the coaxial line (or cable transmission) service, it is useful to introduce a diplexer in the circuitry which connects between the coaxial line and a user of the service, such as a private home. The diplexer serves the function of separating an incoming television signal from an incoming telephony signal so that each of these signals can be processed by separate receivers when in the private home. The diplexer also serves the function of combining telephony and high-speed data (or video) signals outputted by transmitters within the home for presentation to the coaxial line. It is contemplated that, in future communication systems, such diplexers will be mounted at a point of convenience outside of the homes, such as by a physical connection to some part of the transmission-line structure.

It is desirable to minimize the physical size of any communication circuitry, including the diplexer, which may be mounted on the power-line structure. However, a problem exists in that existing diplexer circuitry has a physical size which is larger than that which is desirable for the communication circuitry. This, in turn, requires a larger housing for containing the communication circuitry, which housing is to be mounted on the power-line structure.

SUMMARY OF THE INVENTION

The aforementioned problem is overcome and other advantages are provided by a construction of diplexer, which, in accordance with the invention, provides for a compact configuration and size to the diplexer. The diplexer comprises a high-pass filter and a low-pass filter. The diplexer has three terminals of which a first terminal connects with the coaxial line which is supported by the power-line structure, a second of the terminals is connected to the home and serves as a terminal of a high-pass filter for communicating video and high-speed signals, and the third terminal also connects with the home and serves as the terminal of a low-pass filter for communication of telephony signals. The first terminal serves as a common terminal for both the high-pass filter and the low-pass filter. Each of the filters is constructed in the form of a ladder having serial branches and parallel branches. In the high-pass filter, the serial branches comprise capacitors and the parallel branches comprise inductors, with one of the parallel branches having a series inductor-capacitor circuit. In the low-pass filter, the serial branches comprise inductors and the parallel branches comprise capacitors, one of the parallel branches having an inductor-capacitor series circuit. In the high-pass filter, an output capacitive branch connects directly with the second terminal of the diplexer. In the low-pass filter, a balun and a pair of magnetically coupled coils interconnects the low pass filter with the third terminal of the diplexer. In addition, lightening and surge protection capacitors are provided at the first and the third of the diplexer terminals, such protection being provided also for the second terminal by the output capacitor of the high-pass filter.

The diplexer is constructed upon a planar substrate with components of the filters mounted on either the top surface of the substrate or, alternatively, on both the top and the bottom surfaces of the substrate. In the latter configuration, which is preferred because of its somewhat smaller overall size, electrically conductive vias pass through the substrate to connect filter components disposed on both top and bottom sides of the substrate. In accordance with a feature of the invention, in the construction employing both the top and the bottom sides of the substrate, the inductors of both of the filters are located upon the top side of the substrate, and the capacitors of both of the filters are located on the bottom side of the substrate. In both embodiments of the invention, all of the inductors of both of the filters are constructed as toroids, and all of the capacitors of both the filters are constructed as chips. In the embodiment of the diplexer wherein both the capacitors and the inductors of the filters are located on the top side of the substrate, the inductors lie in planes parallel to the plane of the substrate. In the embodiment wherein the inductors are located on the top side and the capacitors located on the bottom side, the inductors lie in planes perpendicular to the plane of the substrate.

A feature of the invention is in the arrangement of the components of the filters. It is observed that, in each of the filters, the parallel branch of the ladder having the series circuit of inductor and capacitor tends to be a stronger source of radiation, due to oscillation within the branch, than is the case with radiations emitted by other ones of the circuit components. Accordingly, the inductor-capacitor series circuit of the parallel branch of the low-pass filter is located at a distance from the corresponding branch of the high-pass filter. This distance may be maximized by placing the inductor-capacitor series circuit of the respective parallel branches of the filters at opposite edges, or at opposite corners, of the region of the substrate employed for supporting the filter components.

Furthermore, components of filter stages which are relatively close, in terms of their electrical connection, to the first terminal of the diplexer are located relatively close in their positions upon the substrate while the components of stages of the respective filters which are relatively far, in their electrical connection from the first terminal of the diplexer, are positioned with a relatively large spacing upon the substrate. This enhances isolation of signals received at the first terminal and outputted at the second and the third terminals of the diplexer.

In the embodiment of the invention wherein the components are located on both the top and the bottom sides of the substrate, it is advantageous to arrange inductors of three consecutive stages, in each of the filters, with the arrangement of the letter T. This reduces magnetic coupling between the inductors for improved control of bandwidth characteristics of each filter, while enabling the components of the filters to be positioned more closely together for reduction in size of the diplexer.

It is noted that each of the filters of the diplexer operates in reciprocal fashion such that a signal may propagate from its input terminal to its output terminal or from its output terminal to its input terminal. Accordingly, the use of the term "input" and "output" is for convenience in describing the invention, it being understood that signal propagation may be obtained in either direction of signal flow within each of the diplexer filters.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element but may not be referenced in the description for all figures.

DETAILED DESCRIPTION

Figure 1:
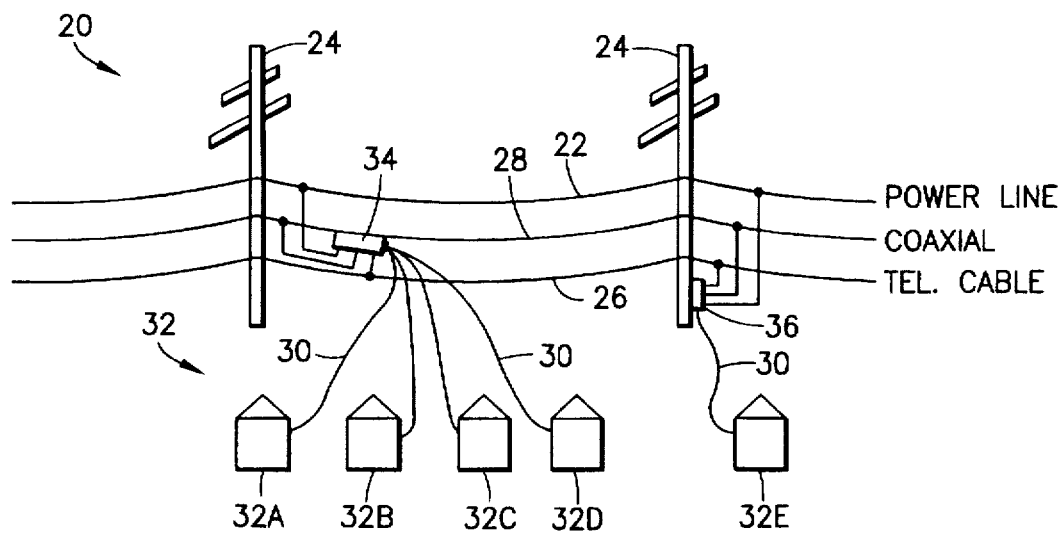
FIG. 1 is a stylized view of telephone poles carrying electric lines for distribution to a plurality of homes of power, high-bandwidth coaxial line signals, and telephone signals.

FIG. 1 shows a power-line structure 20 in which an electric power line 22 is carried by poles 24. A telephone cable 26 and a coaxial transmission line 28 are also carried by the poles 24. Composite cables 30 communicate concurrently electric power of the power line 22, high-speed data signals from the coaxial transmission line 28, and telephony signals from the telephone cable 26 to individual houses 32. Individual ones of the houses are further identified as houses 32A–E. Adapter boxes 34 and 36 contain circuitry for joining the composite cables 30 with the power line 22, the telephone cable 26, and the coaxial transmission line 28. The adapter boxers 34 and 36 have the same construction, and may be mounted at points of convenience. By way of example, the adapter box 34 is shown hanging from the coaxial transmission line 28, and the adapter box 36 is shown mounted directly on one of the poles 24. Each of the adapter boxes 34 and 36 has connections with respective ones of the power line 22, the telephone cable 26, and the coaxial transmission line 28. Included within each of the adapter boxes 34 and 36 is a multiplexer (to be described below) which allows connection to a plurality of the houses, such as the houses 32A–D connecting with the adapter box 34, as well as providing for connection with a single house such as the house 32E connected to the adapter box 36. Also included within each of the adapter boxes 34 and 36 is a diplexer constructed in accordance with the invention, as will be described below. It is to be understood that, in the practice of the invention, the foregoing locations of the diplexer in the boxes 34 and 36 are provided by way of example, and that other locations may be provided, such as a mounting directly within one of the houses 32.

Figure 2:
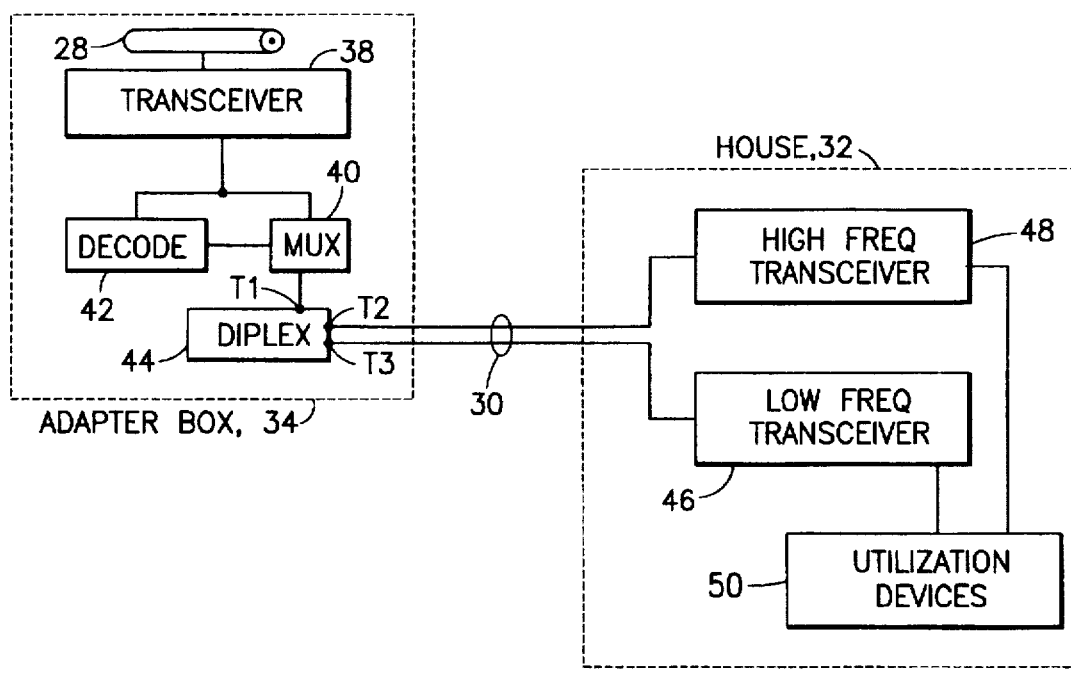
FIG. 2 is a block diagram showing details in the construction of circuitry mounted in a box supported by the power line system of FIG. 1, and corresponding utilization circuitry in one of the houses of FIG. 1, the box having a diplexer constructed in accordance with the invention.

With reference to FIG. 2, the adapter box 34 and its connection to one of the houses 32 is described, it being understood that the description applies also to the adapter box 36. The adapter box 34 comprises a transceiver 38 connecting with the coaxial line 28, and further comprises a multiplexer 40, a decoder 42, and a diplexer 44. The diplexer 44 is constructed in accordance with the invention. Also included in the adapter box 34, but not shown for purposes of simplifying the drawing, are connections to the power line 22 and to the telephone cable 26, which connections are made in conventional manner and, accordingly, need not be shown in the drawing. In the operation of the adapter box 34, the transceiver 38 includes circuitry for transmitting signals received from the house 32 via the cable 30 to the coaxial line 28 for further transmission via the coaxial line 28 to a distant location. The transceiver 38 also comprises circuitry for receiving signals communicated from a distant location via the coaxial line 28. Included within the transceiver 38 are well-known modulation circuits for modulating a signal from the house 32 upon a carrier, and for demodulating a received signal. The multiplexer 40 is operative to switch both incoming and outgoing signals from respective ones of the houses 32A–D to the transceiver 38.

The multiplexer 40 operates in accordance with commands provided by the decoder 42. By way of example, the decoder 42 detects a destination code provided by an incoming signal, and commands the multiplexer 40 to switch the incoming signal to the desired one of the houses 32. The incoming signal, as well as the outgoing signal from any one of the houses 32, may contain a relatively low frequency telephony signal or a relatively high frequency data or television signal, or a telephony signal concurrently with high-speed data or television signals. Incoming and outgoing signals in the telephony frequency band are coupled via the cable 30 between the diplexer 40 and a low-frequency transceiver 46 within the house 32.

Incoming and outgoing signals in the high-speed data band are coupled from the diplexer 44 via the cable 30 to a high-frequency transceiver 48 within the house 32. In each of the houses 32, the transceivers 46 and 48 connect with utilization devices 50 such as telephone equipment, a computer, and a television, by way of example. The transceiver 48 includes circuitry (not shown) for transmission and reception of high-frequency data communication signals, and the transceiver 46 comprises circuitry (not shown) for transmission and reception of telephony signals between the utilization devices 50 and the diplexer 44.

Figure 3:
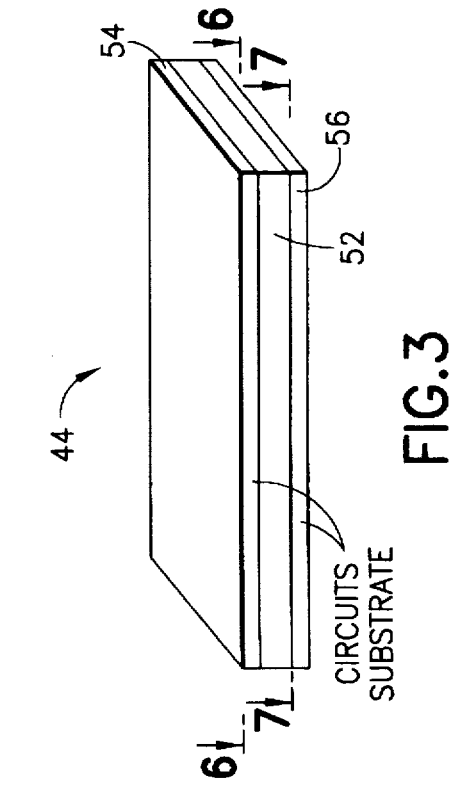
FIG. 3 is a stylized perspective view of the diplexer of FIG. 2.

FIG. 3 shows details in the construction of the diplexer 44. The diplexer 44 comprises a substrate 52 of dielectric, electrically insulating material such as a combination of fibrous glass with epoxy. Components of electric circuitry 54 of the diplexer 44 may be supported on the top surface of the substrate 52 with additional components of circuitry 56 supported, if desired, on the bottom side of the substrate 52. As will be described hereinafter, the circuitry of the diplexer 44 comprises a low-pass filter and a high-pass filter, each of which is composed of inductors and capacitors. The capacitors are formed as chips, and the inductors are formed as toroids, one such toroid 58 being shown in FIG. 4. The toroid 58 comprises turns of a winding 60 about a ferrite core 62. Also shown in FIG. 4, by way of example, are lands 64 and 66 by which ends of the coil winding 60 are secured to the substrate 52. A terminal 68 of the diplexer 44 is also shown by way of example, the terminal 68 connecting with the land 62.

Figure 5:
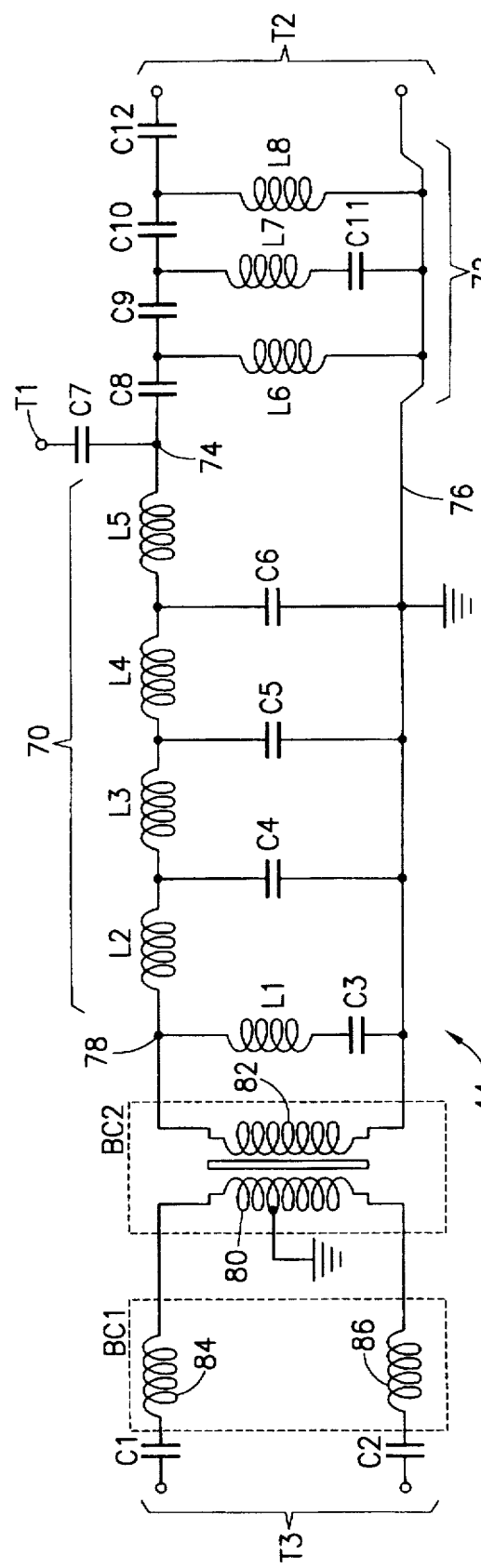
FIG. 5 is a schematic diagram of the diplexer in accordance with a first embodiment of the invention.

In FIG. 5, a section of the diplexer 44 is constructed as a low-pass filter 70, and a further section of the diplexer 44 is constructed as a high-pass filter 72. The low-pass filter 70 comprises five inductors L1–L5 and four capacitors C3–C6. The high-pass filter 72 comprises three inductors L6–L8 and five capacitors C8–C12. A first terminal, T1, of the diplexer is connected via a capacitor C7 to a node 74 at a junction between the filter 70 and 72. A terminal pair constituted of one terminal of the capacitor C12 and ground 76 serves as a second terminal, T2, of the diplexer 44. To facilitate description of the circuit of FIG. 5, the node 74 may be referred to as an input terminal of the filter 70 and also of the filter 72. The diplexer 44 operates in reciprocal fashion such that signals may travel from the terminal T1 to the terminal T2, as well as from the terminal T2 to the terminal T1. Accordingly, the terminal T2 may be referred to as the output terminal of the high-pass filter 72. Node 78 between the inductors L1 and L2 may be regarded as an output terminal of the low-pass filter 70, it being understood that the filter 70 operates in reciprocal fashion, and that the use of the term "output terminal" is for purposes of convenience in describing the invention.

The output terminal of the low-pass filter 70 connects with a balun BC2, the balun BC2, in turn, connecting via a coil assembly BC1 and capacitors C1 and C2 to terminal T3 which represents a third terminal of the diplexer 44. The terminal T3 may be regarded as a further output terminal of the diplexer 44.

The low-pass filter 70 is constructed as a four-stage ladder network wherein the first stage comprises inductor L5 and capacitor C6, the second stage comprises inductor L4 and capacitor C5, the third stage comprises inductor L3 and capacitor C4, and the fourth stage comprises the series branch of inductor L2 and the parallel branch of inductor L1 connected in series with the capacitor C3. The capacitors C4, C5, and C6, along with the series circuit of L1 and C3 constitute parallel branches of the ladder network, and the inductors L2, L3, L4 and L5 constitute series branches of the ladder network. In similar fashion, in the high-pass filter 72, the capacitors C8, C9, C10, and C12 constitute series branches of the ladder network, and the parallel branches of the ladder network are constituted by inductor L6, inductor L8, and the series circuit of inductor L7 with capacitor C11. The first stage of the ladder network of the filter 72 comprises capacitor C8 and inductor L6, the second stage of the ladder comprises capacitor C9 and the series circuit of L7 and C11, and the third stage of the ladder comprises capacitor C10 and inductor L8. The third stage connects via capacitor C12 to terminal T2.

The balun BC2 comprises a first coil 80 and a second coil 82. The first coil 80 is center-tapped to ground to provide for a balanced configuration of circuit parameters of terminals of the first coil 80. The second coil 82 is connected between the node 78 and ground, and constitutes the unbalanced portion of the circuitry connected at the balun BC2. The coil assembly BC1 comprises a first inductor 84 and a second inductor 86 connected respectively to terminals of the balun coil 80, and are magnetically coupled for improved balance to signals propagating within the balun coil 80. The terminal T3 comprises a pair of terminals connecting via the capacitors C1 and C2, and respectively via the inductors 84 and 86 to the terminals of the balun coil 80. The capacitors C1, C2, C7, and C12 also serve the function of protecting the diplexer 44 from electric surges, such as lightning and, in view of the series connection between T1 and T2, and in view of the series connection between T1 and T3, the surge protection is provided also to the houses 32 of FIG. 1. The low-pass filter 70 and the high-pass filter 72 are fabricated in accordance with well-known design principles to provide a desired spectral passband. By way of example, the low-pass filter 70 may have a bandwidth of 5–40 MHz (megahertz) and the high-pass filter 72 may have a passband of 54–750 MHz. These particular passbands are given by way of example, it being understood that specific values of the passbands are chosen in accordance with the parameters of specific communication systems in which the diplexer 44 may be employed.

Figure 6:
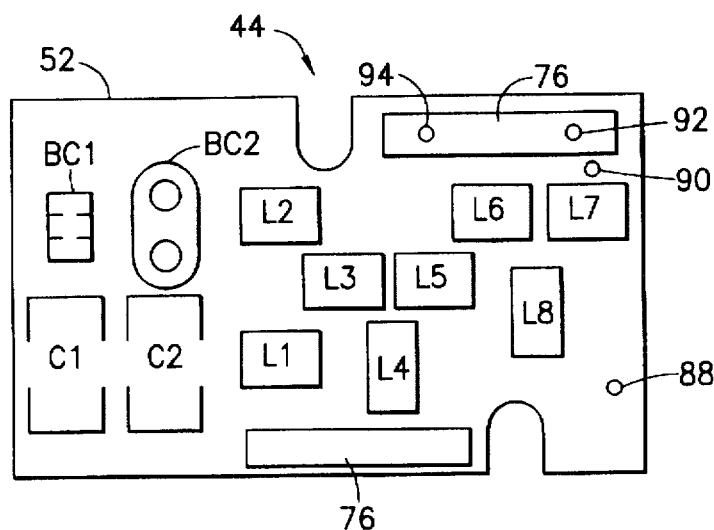
FIG. 6 shows an arrangement of inductors of FIG. 5 on a top surface of a substrate of the diplexer, the view of FIG. 6 being taken along the line 6—6 of FIG. 3.
Figure 7:
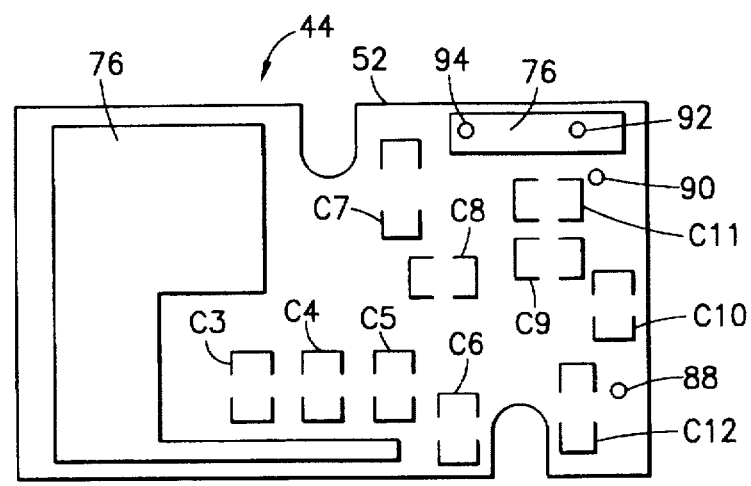
FIG. 7 shows an arrangement of capacitors of various stages of the filters of the diplexer, the view of FIG. 7 being taken along the line 7—7 of FIG. 3.

As shown in FIGS. 6 and 7, and in accordance with the invention, a reduced physical size of the diplexer 44 is attained by positioning the various electric components of the diplexer 44 in close proximity to each other while retaining adequate signal isolation between the various components. In accordance with the embodiment of the invention of FIGS. 5–7, this is accomplished by placing the inductors L1–L8 on the top side of the substrate 52, as shown in FIG. 6, and by mounting the capacitor C3–C12 on the bottom side of the substrate 52, as shown in FIG. 7. The capacitors C1 and C2 , the coil assembly BC1, and the balun BC2 are also mounted on the top surface of the substrate 52, as shown in FIG. 6. Ground 76 is implemented by various layers of electrically conductive material, such as copper, which are portrayed in FIGS. 6 and 7 at various locations, by way of example.

Communication between circuit components on the top side of the substrate 52 with circuit components on the bottom side of the substrate 52 is accomplished by vias such as the vias 88, 90, 92, and 94. Thus, by way of example, the via 88 is positioned for coupling signals between the inductor L8 and the capacitors C10 and C12. The via 90 is positioned for coupling signals between the inductor L7 and the capacitor C11. The vias 92 and 94 are positioned for establishing continuity of ground 76 between a layer of grounding material on the top side of the substrate 52 with further grounding material of the ground 76 being located on the bottom side of the substrate 52. The mounting of the toroidal inductors L1–L8 and the chip capacitors C1–C12 upon the substrate 52 is accomplished in accordance with accepted common practice in the construction of the printed circuit boards. Accordingly, the numerous conductive strips, constructed as laminates upon the top and the bottom sides of the substrate 52, have been omitted to simplify the drawing. It is to be understood, however, that the lengths of these conductive strips are to be kept as short as practical. A short interconnection between electrical components reduces the intensities of radiated signals so as to ensure isolation between the filters 70 and 72, as well as reduced coupling among components within either one of the filters 70 and 72 for attainment of a desired spectral characteristic to each of the filters 70 and 72.

Figure 4:
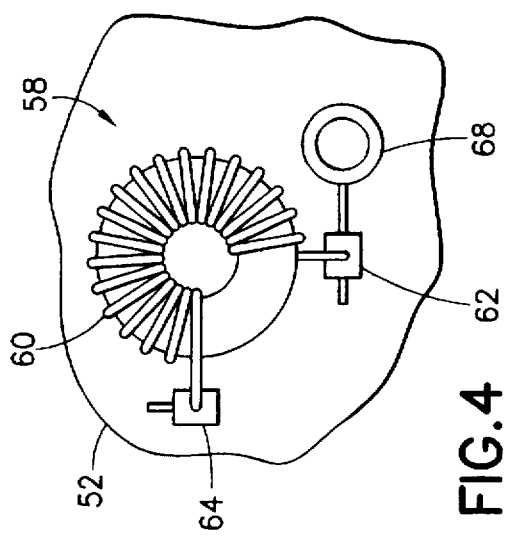
FIG. 4 shows a plan view of an inductor of toroidal construction employed in construction of filters of the diplexer.

With reference to the plan views of FIGS. 4 and 6, it is noted that a toroidal form of inductor, such as the toroid 58, has a circular configuration when disposed in a plane parallel to the plane of the substrate 52, but has a rectangular configuration when mounted in a plane perpendicular to the plane of the substrate 52. Thus, in FIG. 4, the configuration of the toroid 58 is circular while, in FIG. 6, the configurations of the inductors L1–L8 are rectangular. Thus, FIG. 6 shows a mounting of the inductors wherein the toroid of each inductor is in a plane perpendicular to the plane of the substrate 52.

In accordance with a feature of the invention, and with reference to FIGS. 4–6, isolation between the inductors L6, L7, and L8 of the successive stages of the filter 72 is obtained by mounting the inductors L6, L7, and L8 in the configuration of the letter T. Thus, the edges of the respective toroids of the inductors L6–L8 approach each other while the planar surfaces of the respective toroids are perpendicular to each other. This arrangement of the inductors L6–L8 minimizes magnetic coupling between the inductors so as to permit a closer spacing of the inductors while retaining the desired spectral characteristics of the filter 72. In similar fashion, the inductors L3, L4, and L5 of successive stages of the filter 70 are arranged in the configuration of a T to provide for reduced magnetic interaction among the inductors L3–L5. Also, the T configuration of the inductors L6–L8 and the T configuration of the inductors L3–L5 are spaced apart from each other with minimal overlap. The minimal overlap occurs between the inductors L5 of the filter 70 and L6 of the filter 72 wherein there is a slight overlap of approximately 25 per cent as shown in FIG. 6. By arranging the components for increasing the spacing between the two T configurations, and reducing overlap among neighboring inductors of the two T configurations, coupling between the filters 70 and 72 is reduced. This permits a reduction in the overall size of the diplexer 44, thereby to accomplish an object of the invention, in accomplishing the reduction of the physical size of the diplexer 44.

Tuning of the filters 70 and 72 is accomplished by adjustment of each of the respective inductors L1–L8. Thereby, by placing the inductors L1–L8 on the top side of the substrate 52 and by placing the capacitors C3–C7 on the bottom side of the substrate 52, all tuning of the filters 70 and 72 can be accomplished by adjustments made on only the top side of the substrate 52.

A further feature of the invention concerns relatively intense radiation emitted, at resonance, by the parallel branch L7 and C11 of the filter 72 and the parallel branch L1 and C3 of the filter 70. In order to avoid interaction of the two filters 72 and 70, so as to insure separation of signals in the respective spectral bands of the filters 70 and 72, it is desirable to maximize the distance between the branch having the inductor L7 and the capacitor C11 from the branch having the inductor L1 and the capacitor C3. As shown in FIGS. 6 and 7, the capacitor C3 is mounted close to the inductor L1 to facilitate interconnection of these two filter components. Similarly, the capacitor C11 is mounted close to the inductor L7 to facilitate connection of these two filter components. Thus, the branch of inductor L1 and capacitor C3 occupies one part of the region of the substrate 52 which is set aside for the mounting of the filter components while the branch having the inductor L7 and the capacitor C11 is mounted in a separate part of the foregoing region. As shown in FIG. 6, the inductors L1 and L7 are mounted in diametrically opposite positions of the region of the substrate 52 reserved for the filter components. This maximizes the spacing between these two branches so as to attain best isolation among the signals propagating through the filters 70 and 72.

It is to be understood that the series resonant circuit of inductor L1 and capacitor C3, as well as the series resonant circuit of inductor L7 and capacitor C11, are presented by way of example in the construction of the diplexer 44 and that, alternatively, a parallel combination of inductor and capacitor (not shown) may be employed as a resonant tank circuit. The overall dimensions of the substrate 52 provide for a length of 1.5 inches and a width of 0.8 inches. This is substantially less than a wavelength of the highest frequency signal propagating through the diplexer 44. Thus, the operation of the diplexer 44 is in accordance with discreet components and without any significant development of traveling electromagnetic waves. Typical values of impedance at the balun BC2 are 75 ohms between the node 78 and ground at the unbalanced side, and 100 ohms at the balanced side.

Figure 8:
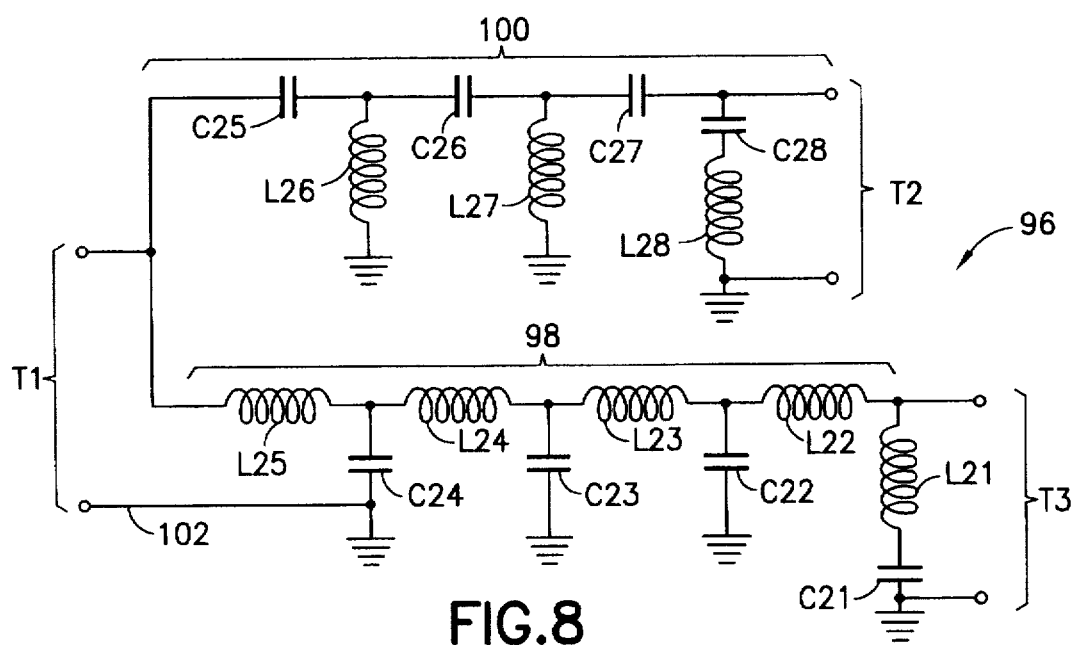
FIG. 8 is a schematic diagram of a diplexer in accordance with a second embodiment of the invention.
Figure 9:
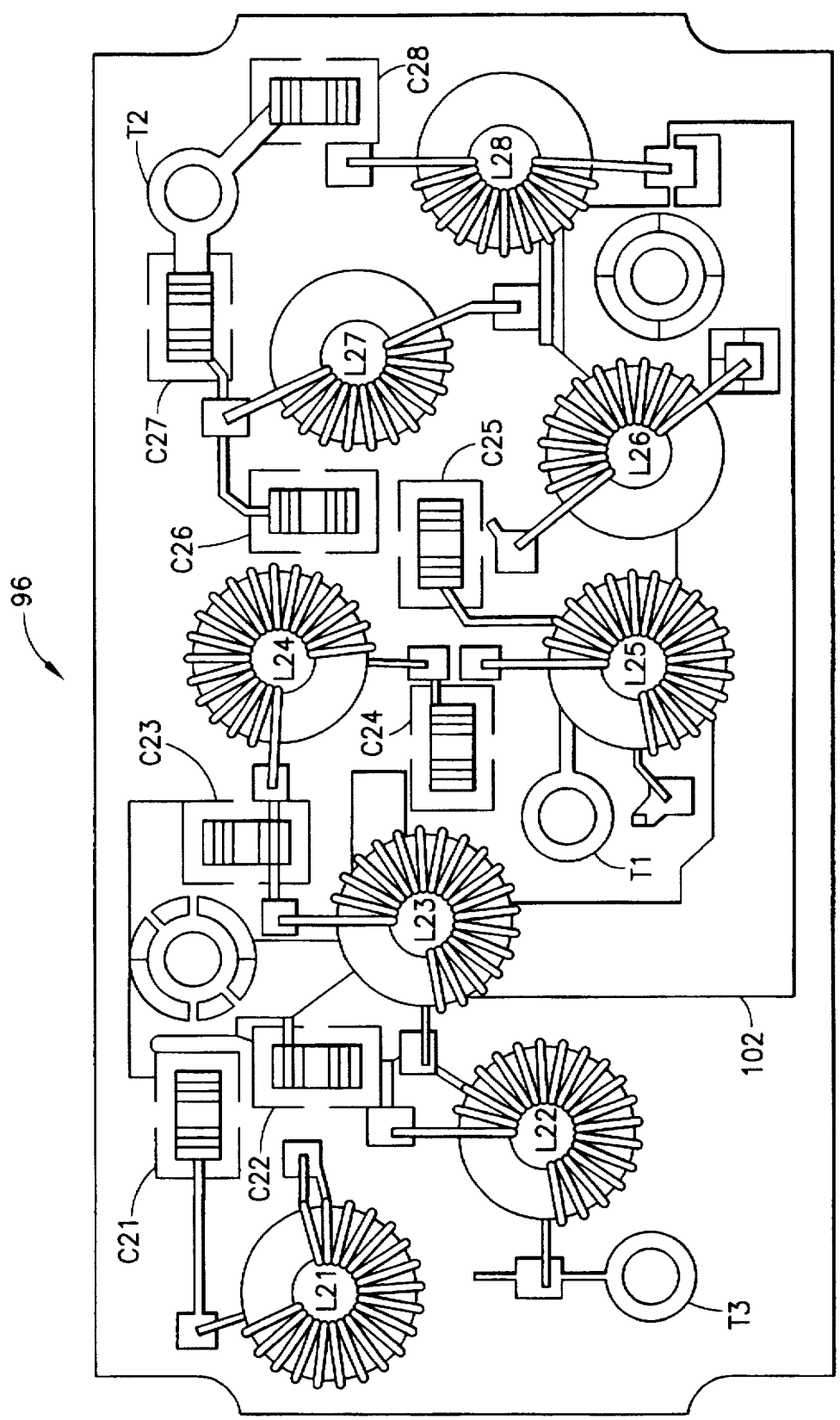
FIG. 9 is a stylized plan view of the diplexer of FIG. 8 showing an arrangement of inductors and capacitors on a single side of the substrate of the diplexer.

FIGS. 8 and 9 show a diplexer 96 which is an alternative embodiment of the diplexer 44 of FIGS. 5–7. The circuitry of the diplexer 96 includes a low-pass filter 98 and a high-pass filter 100. The circuitry of the high-pass filter 100 of FIG. 8 is similar to that of filter 72 of FIG. 5, and the circuitry of the low-pass filter 98 of FIG. 8 is similar to that of the filter 70 of FIG. 5. In FIG. 8, both of the filters 98 and 100 connect to a common input terminal T1, the high-pass filter 100 terminates in a terminal T2 which serves as an output terminal of the diplexer 96, and the low-pass filter 98 terminates in a terminal T3 which serves as a further output terminal of the diplexer 96. It is noted that the general form of construction of the diplexer 96 of FIG. 8 is similar to that of the diplexer 44 of FIG. 5. In FIG. 8, the high-pass filter 100 comprises series elements of a ladder network, the series elements being C25, C26, and C27 with parallel branches of inductors L26, L27, and a parallel branch of the series circuit C28 and L28. In the low-pass filter 98, there is a ladder network comprising the series branches comprising respectively inductors L25, L24, L23, and L22, and parallel branches comprising capacitors C24, C23, C22, and a further parallel branch comprising a series circuit of inductor L21 and capacitor C21. The electrical operation of the diplexer 96 is similar to that of the diplexer 44 and, accordingly, need not be described in further detail.

In this embodiment of the invention, all of the filter components of capacitors C21–C28 and inductors L21–L28 are located on the top side of the substrate 52. A ground 102, is developed as a layer of electrically conductive material, such as copper, on the top side of the substrate 52. All of the inductors L21–L28 are configured as toroids which are disposed in planes parallel to the plane of the substrate 52. Thus, as shown in FIG. 9, the toroids lie upon other electrical components of the circuitry, particularly interconnecting circuit lines between the capacitors and the inductors. To provide for isolation between the magnetic field of adjacent ones of the inductors L21–L28, the inductors are positioned with the edge region of a toroid of one inductor facing the edge region of a toroid of an adjacent inductor.

The capacitors C21–C28 are located for minimizing the lengths of interconnecting conductor strips between the capacitors and between capacitors and the inductors. The inductors L26, L27, and L28 of the three stages of the high-pass filter 100 are located on the right hand side of the substrate 52, as portrayed in Fig. 9, while the inductors L21–L25 of the respective stages of the low-pass filter 98 are located in the central and left side of the substrate 52, as portrayed in FIG. 9. Also, with respect to the relatively high intensity of electromagnetic radiation emanating from the series circuit of the capacitor C28 and inductor L28 in a parallel branch of the filter 100, and also from the series circuit of inductor L21 and capacitor C21 in a parallel branch of the filter 98, coupling due to these radiations is minimized by locating the respective parallel branches at opposite ends of the diplexer 96.

The foregoing spacing of capacitor C28 and inductor L28 from capacitor C21 and inductor L21 improves isolation between signals propagating in the filters 100 and 98 so as to allow the components of the two filters 100 and 98 to be placed more closely together with a consequent reduction in size of the diplexer 96. In the overall dimensions of the diplexer 96, the length of the diplexer is 1.8 inches and the width of the diplexer is 0.8 inches. Thus, the overall dimensions of the diplexer 44 of FIGS. 5–7 are smaller than the overall dimensions of the diplexer 96 of FIGS. 8–9 due to the use of both sides of the substrate in the diplexer 44 and the perpendicular orientation of the inductors, while the diplexer 96 employs only the top side of the substrate 52 and horizontally disposed inductors. Thereby, with either embodiment of the diplexer of the invention, the close packing of the components of the diplexer has resulted in a reduction in the physical size of the diplexer.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A diplexer comprising:

a low-pass filter and a high-pass filter;

a first terminal serving as a common input terminal to both of said filters, a second terminal serving as an output terminal of said high-pass filter, and a third terminal serving as an output terminal of said low-pass filter;

wherein each of said filters comprises inductors and capacitors arranged in successive stages in the configuration of a ladder network having series branches and parallel branches;

wherein, in said high-pass filter, each of a plurality of said series branches comprises a capacitor, each of a plurality of said parallel branches comprises an inductor, and one of said parallel branches comprises a resonant circuit of a first inductor and a first capacitor;

wherein, in said low-pass filter, each of a plurality of said series branches comprises an inductor, each of a plurality of said parallel branches comprises a capacitor, and one of said parallel branches comprises a resonant circuit of a second inductor and a second capacitor;

said diplexer further comprises a dielectric substrate supporting said inductors and said capacitors of each of said filters, said substrate having a top side and a bottom side opposite said top side;

said inductors of both of said filters and said capacitors of both of said filters are located within a common region of said substrate; and said first inductor and said second inductor are spaced apart and are located at opposite parts of said common region, and said first capacitor and said second capacitor are spaced apart and are located at opposite parts of said common region.

2. A diplexer according to claim 1 further comprising a balun connected between a stage of said low-pass filter and said third terminal.

3. A diplexer according to claim 2 further comprising a pair of magnetically coupled inductors connected to balanced terminals of said balun, and connecting said balun with said third terminal.

4. A diplexer according to claim 2 further comprising electric surge protection capacitors at said first and said third terminals, a capacitor of said high-pass filter serving as a surge protection capacitor at said second terminal.

5. A diplexer according to claim 1 wherein inductors of both of said filters are located on the top surface of said substrate region, and said capacitors of both of said filters are located on the bottom surface of said substrate region.

6. A diplexer according to claim 5 wherein said substrate is a planar substrate, and each of said filters has at least three stages and, in each of said filters, inductors of three successive ones of the stages comprise toroids disposed in planes perpendicular to a plane of the substrate, and are arranged in the configuration of a T to inhibit coupling between the inductors of the three successive stages.

7. A diplexer according to claim 1 wherein each of said inductors in both of said filters comprises a toroid and wherein, in each of said filters, the succession of stages begins with a first stage connecting with said first terminal and terminates with a final stage;

in each of said stages, the inductors and the capacitors are electrical components of the stage; and wherein locations of electrical components of the first stages of both of said filters are relatively close to each other, and locations of electrical components of the final stage of said low-pass filter are relatively far from locations of electrical components of the final step stage of said high-pass filter.

8. A diplexer according to claim 7 wherein the substrate is a planar substrate, and all of the inductors of both of said filters lie in planes parallel to a plane of said substrate.

9. A diplexer comprising:

a low-pass filter and a high-pass filter;

a first terminal serving as a common input terminal to both of said filters, a second terminal serving as an output terminal of said high-pass filter, and a third terminal serving as an output terminal of said low-pass filter;

wherein each of said filters comprises inductors and capacitors arranged in successive stages in the configuration of a ladder network having series branches and parallel branches;

in said high-pass filter, each of a plurality of said series branches comprises a capacitor, and each of a plurality of said parallel branches comprises an inductor;

in said low-pass filter, each of a plurality of said series branches comprises an inductor, and each of a plurality of said parallel branches comprises a capacitor;

said diplexer further comprises a dielectric substrate supporting said inductors and said capacitors of each of said filters;

each of said inductors in both of said filters comprises a toroid and wherein, in each of said filters, the succession of stages begins with a first stage connecting with said first terminal and terminates with a final stage;

in each of said stages, the inductors and the capacitors are electrical components of the stage; and wherein locations of electrical components of the first stages of both of said filters are relatively close to each other, and locations of electrical components of the final stage of said low-pass filter are relatively far from locations of electrical components of the final stage of said high-pass filter, thereby to enhance isolation of an electric signal of said low-pass filter from an electric signal of said high-pass filter.

* * * * *